(12) United States Patent
Han

(10) Patent No.: US 6,917,224 B2
(45) Date of Patent: Jul. 12, 2005

(54) FREQUENCY SYNTHESIZER AND FREQUENCY SYNTHESIZING METHOD

(75) Inventor: Yun-Cheol Han, Daegu Metropolitan (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/762,518

(22) Filed: Jan. 23, 2004

(65) Prior Publication Data

US 2004/0212403 A1 Oct. 28, 2004

(30) Foreign Application Priority Data

Apr. 22, 2003 (KR) ................................ 10-2003-0025534

(51) Int. Cl.[7] .............................................. H03B 21/00
(52) U.S. Cl. ..................................... 327/105; 327/107
(58) Field of Search ................................ 327/105, 107, 327/113, 114; 455/260; 331/10, 18

(56) References Cited

U.S. PATENT DOCUMENTS 4,159,527 A * 6/1979 Yahata et al. ............... 708/276
6,727,764 B2 * 4/2004 Manku et al. ................ 331/57
6,774,706 B2 * 8/2004 Miyazaki et al. ........... 327/534

* cited by examiner

Primary Examiner—Tuan T. Lam
(74) Attorney, Agent, or Firm—Harness, Dickey & Pierce, PLC

(57) ABSTRACT

Provided are a frequency synthesizer and a frequency synthesizing method. The frequency synthesizer includes a ring oscillator, duty buffers, half adders, and a switch. The ring oscillator receives a pair of input signals and generates a pair of oscillating signals. The duty buffers receive the pair of oscillating signals of the ring oscillator and generates output signals with predetermined duty cycles. The half adders receive output signals of the duty buffers and generate an output signal as a result of an Exclusive-OR operation on the output signals of the duty buffers and an output signal as a result of an AND operation on the output signals of the duty buffers. The switch selects one of the oscillating signals of the ring oscillator, the output signals as results of the Exclusive-OR operation, and the output signals as results of the AND operation. By using the frequency synthesizer, it is possible to select one of an oscillating-frequency output signal of a high-frequency ring oscillator, an output signal of a high-frequency that is two times higher than that of the oscillating frequency of the ring oscillator bock, and an output signal of a frequency that is the same as that of an input signal.

15 Claims, 10 Drawing Sheets

C_OUT

EX_OUT

AND_OUT

C_OUT

EX_OUT

AND_OUT

FREQUENCY SYNTHESIZER AND FREQUENCY SYNTHESIZING METHOD

CROSS REFERENCE TO RELATED APPLICATION

This application claims the priority of Korean Patent Application No. 2003-25534, filed on Apr. 22, 2003, in the Korean Intellectual Property Office, the disclosure of which is hereby incorporated by reference in its entirety.

BACKGROUND OF THE INVENTION

1. Field of the Invention

The present invention generally relates to a semiconductor integrated circuit. In particular, the present invention generally relates to a frequency synthesizer and a frequency synthesizing method.

2. Description of the Related Art

With the increasing demand for information communications, the mobile communication system market is expanding rapidly. Thus, a great deal of research is being done in relation to low-cost, low-power consumption, and small-volume systems. As a result, Complementary Metal Oxide Semiconductor (CMOS) process technology, and semiconductor devices using a small-size chip and operating at a high-frequency have been introduced.

A high-frequency, low-noise, and low-power phase-locked loop (PLL) may be used in various fields such as optical data links and asynchronous transfer mode (ATM) systems. The PLL normally has a high operating frequency, a short response time, small clock jitter, a wide input locking range, and a linear voltage-to-frequency conversion characteristic. These characteristics of the PLL serve as factors in determining the performance of a voltage controlled oscillator (VCO). In general, the VCO is designed using an LC tank circuit or a ring oscillator.

FIG. 1 illustrates a conventional LC tank circuit according to the Related Art. Referring to FIG. 1, in an LC tank circuit 100, two pairs of an inductor L and a capacitor C are series connected between a supply voltage VDD and a ground voltage VSS. Inductors L and capacitors C connect at nodes 102 and 104, respectively. NMOS transistors MT1 and MT2 are connected between nodes 102 and 104, respectively, and the ground voltage VSS. Gates of transistors MT2 and MT1 are cross-connected to nodes 102 and 104, respectively. In the LC tank circuit 100, an output voltage Vout typically oscillates according to discharging/charging operations of capacitors C.

The LC tank circuit 100 normally has a high Q value and may produce a clear signal due to low phase noise and small clock jitter. However, the LC tank circuit 100 typically has a small tuning range and may need a large layout area to form inductors.

A VCO using a ring oscillator typically may be easily integrated because a ring oscillator typically requires a small layout area. Such a ring-oscillator-type VCO typically has a large operational range. However, the VCO that uses a ring oscillator normally cannot implement high-frequency operation and may undesirably generate large phase noise.

SUMMARY OF THE INVENTION

An example embodiment of present invention provides a frequency synthesizer, which can operate in a wide range of high frequencies can accurately select an operating frequency and/or can exhibit high integration density.

Another exemplary embodiment of present invention provides a frequency synthesizing method by which a high operating frequency can be generated and selected.

An exemplary embodiment of present invention provides a frequency synthesizer including a ring oscillator having input thereto a pair of input signals, the ring oscillator for generating a pair of oscillating signals; duty buffers having input thereto the pair of oscillating signals, the duty buffers for generating output signals with predetermined duty cycles; half adders having input thereto the output signals, the half adders for generating an output signal as a result of an Exclusive-OR operation on the output signals of the duty buffers and an output signal as a result of an AND operation on the output signals of the duty buffers; and a switch for selecting one of the oscillating signals of the ring oscillator, the output signal as a result of the Exclusive-OR operation, and the output signal as a result of the AND operation.

An exemplary embodiment of present invention provides a frequency synthesizer including a ring oscillator having a pair of input signals input thereto and, in response to a control signal, the ring oscillator generates a pair of first oscillating signals, a pair of second oscillating signals, and a pair of third oscillating signals being delayed by a predetermined amount of time; duty buffers having the pair of first oscillating signals and the pair of second oscillating signals of the ring oscillator input thereto, the duty buffers for generating first and second output signals having duty cycles being 50%; half adders receiving output signals of the duty buffers, the half adders for generating an output signal as a result of an Exclusive-OR operation on the first and second output signals of the duty buffers and an output signal as a result of an AND operation on the first and second output signals of the duty buffers; and a switch for selecting select one of a third oscillating signal of the ring oscillator, the output signal as a result of the Exclusive-OR operation, and the output signal as a result of the AND operation.

An exemplary embodiment of present invention provides a frequency synthesizing method including receiving a pair of input signals and, in response to a control signal, generating a pair of first oscillating signals, a pair of second oscillating signals, and a pair of third oscillating signals that are delayed by a predetermined amount of time; receiving the pair of first oscillating signals and the pair of second oscillating signals of the ring oscillator and generating first and second output signals having duty cycles being substantially 50%; receiving output signals of the duty buffers and generating an output signal as a result of an Exclusive-OR operation on the first and second output signals of the duty buffers and an output signal as a result of an AND operation on the first and second output signals of the duty buffers; and selecting one of a third oscillating signal of the ring oscillator, the output signal as a result of the Exclusive-OR operation, and the output signal as a result of the AND operation.

According to the present invention, by using the frequency synthesizer, it is possible to select one of an oscillating-frequency output signal of a high-frequency ring oscillator, an output signal of a high-frequency that is two times higher than that of the oscillating frequency of the ring oscillator bock, and an output signal of a frequency that is the same as that of an input signal.

BRIEF DESCRIPTION OF THE DRAWINGS

The exemplary embodiments of the present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
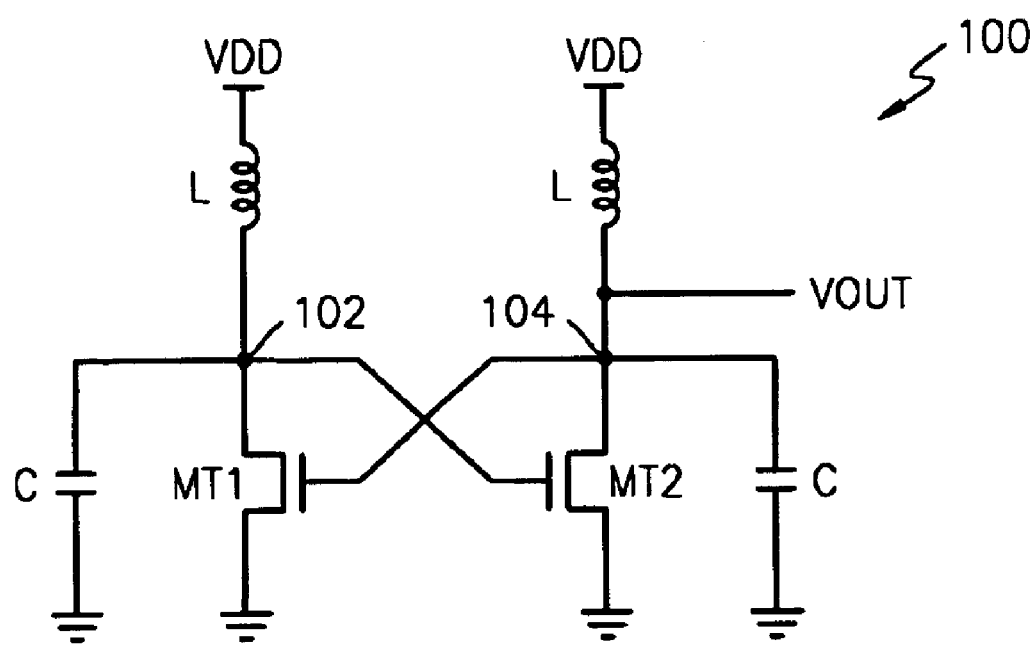
FIG. 1 illustrates a conventional LC tank circuit according to the Related Art.

The present invention will now be described more fully with reference to the accompanying drawings, in which exemplary embodiments of the present invention are shown. In the drawings, like reference numerals are used to refer to like elements throughout.

Figure 2:
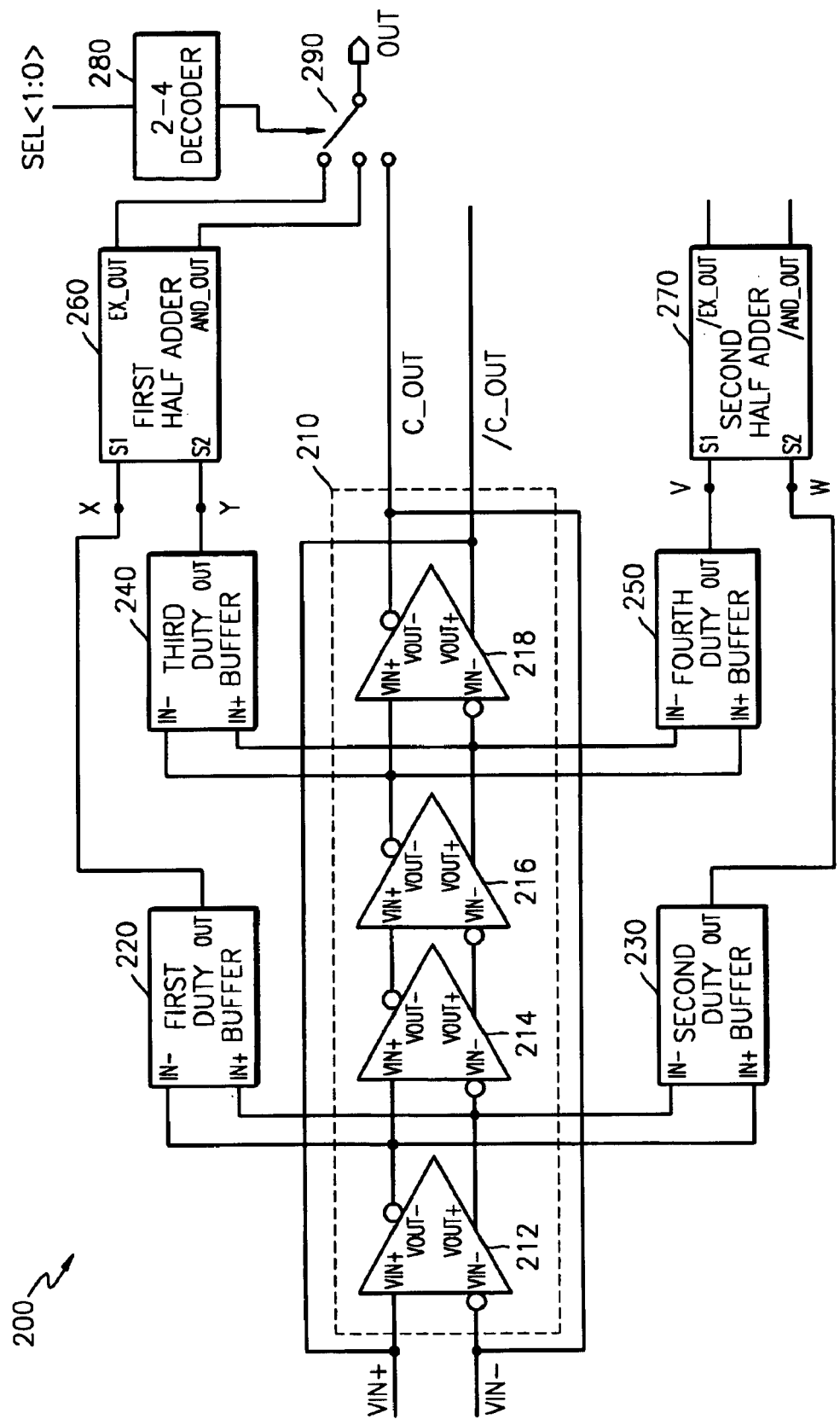
FIG. 2 illustrates a frequency synthesizer according to an exemplary embodiment of the present invention.

FIG. 2 illustrates a frequency synthesizer 200 according to an exemplary embodiment of the present invention. Referring to FIG. 2, frequency synthesizer 200 may oscillate an output signal of a dual-band frequency, and therefore will be called "a dual-band VCO circuit". The dual-band VCO circuit 200 may include a four-stage ring oscillator structure 210, first through fourth duty buffers 220, 230, 240, and 250, a first half adder 260, a second half adder 270, a 2:4 decoder 280 and a switch 290.

The four-stage ring oscillator structure 210 may receive a first input signal VIN+ and a second input signal VIN− at a pair of input terminals and may output output signals C_OUT and its inversion /C_OUT. The first input signal VIN+ and the second input signal VIN− are generally considered 180° out of phase. The four-stage ring oscillator structure 210 include may include four ring oscillators 212, 214, 216, and 218.

Figure 3:
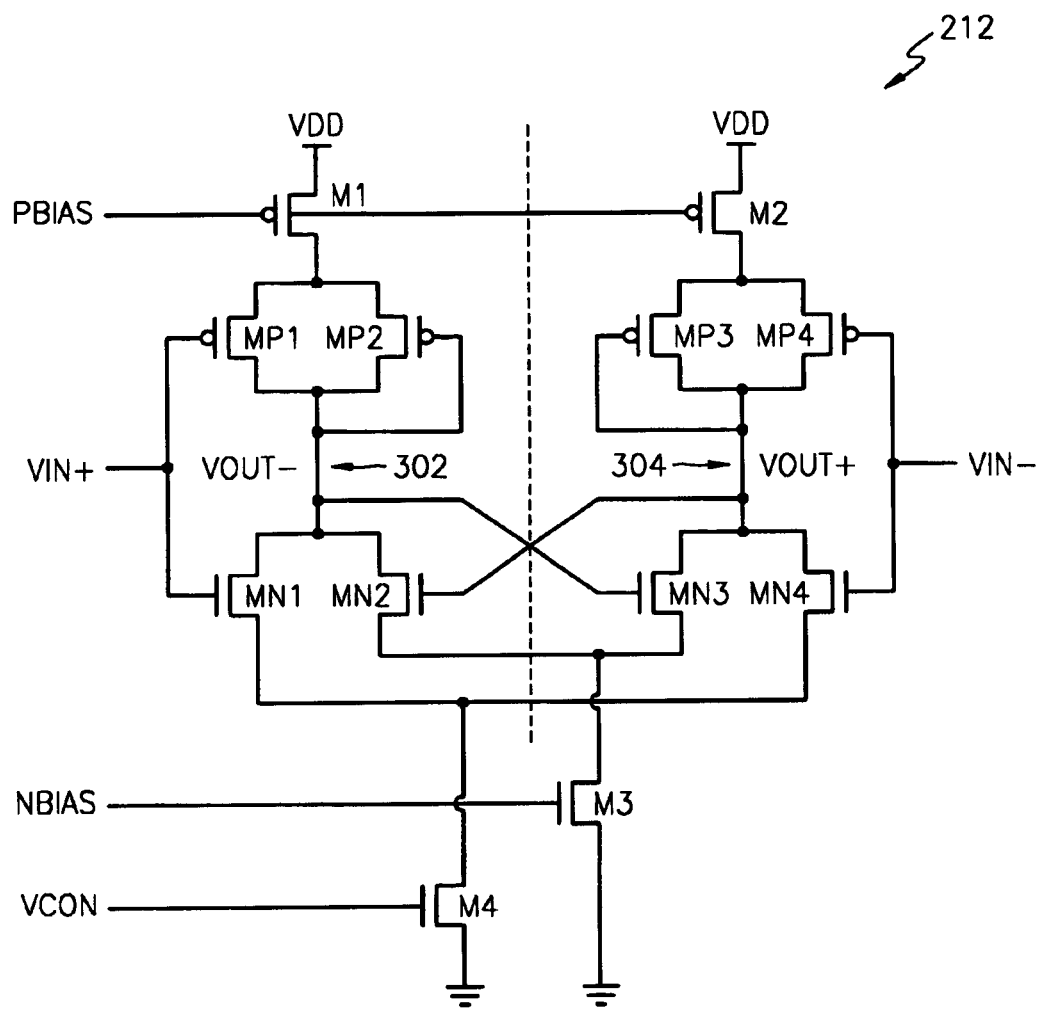
FIG. 3 illustrates a ring oscillator of FIG. 2, according to an example embodiment of the present invention.

FIG. 3 illustrates the first ring oscillator 212 of FIG. 2 as a representative of the four ring oscillators 212, 214, 216, and 218, according to an embodiment of the present invention. Referring to FIG. 3, the first ring oscillator 212 may include PMOS transistors M1 and M2, PMOS transistors MP1 and MP2, PMOS transistors MP3 and MP4, NMOS transistors MN1 and MN2, NMOS transistors MN3 and MN4, NMOS transistor M3, and NMOS transistor M4. The PMOS transistors M1 and M2 may be connected to a supply voltage VDD and their gates may be connected to a first bias signal PBIAS. Gates of the PMOS transistor MP1 and the NMOS transistor MN1 may be connected to the first input signal VIN+. Gates of the PMOS transistor MP4 and the NMOS transistor MN4 may be connected to the second input signal VIN−. The gate of the NMOS transistor M4 is normally connected to a control signal VCON. The gate of the NMOS transistor M3 may be connected to a second bias signal NBIAS.

NMOS transistor M4 may be connected between commonly connected source terminals of the NMOS transistors MN1 and MN4 and the ground voltage VSS. Similarly, NMOS transistor M3 may be connected between commonly connected source terminals of the NMOS transistors M2 and M3 and the ground voltage VSS.

The drain terminal of transistor MP2 may be connected at a node 302 to the drain terminals of transistors MN1 and MN2, its own gate terminal and the drain terminal of transistor MP1. The source terminals of transistors MP2 and MP1 may be connected to the drain terminals of transistor M1. The drain terminal of transistor MP3 is connected at node 204 to its own gate terminal and the commonly connected drain terminals of transistors MN3 and MN4 and to the source terminal of transistor MP3. The gates of transistors MN2 and MN3 are normally cross-connected at nodes 304 and 302, respectively. Connection points of the source terminals of transistors MP3 and MP4 are connected to the drain terminal of transistor M2. A first output signal VOUT+ is applied to node 304. A second output signal VOUT− is applied to node 302.

Figure 4:
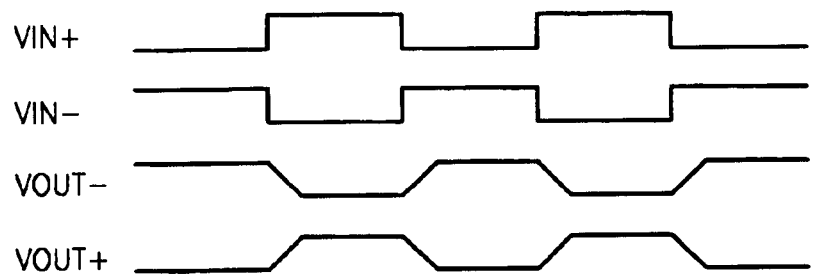
FIG. 4 illustrates waveforms of signals related to the operation of a ring oscillator of FIG. 3, according to an example embodiment of the present invention.

The first bias signal PBIAS, the second bias signal NBIAS, and the control signal VCON can together control the first ring oscillator 212. Waveforms of signals PBIAS, NBIAS and VCON are depicted in FIG. 4, according to an embodiment of the present invention. As shown in FIG. 4, the first ring oscillator 212 operates such that the second output signal VOUT− is generated as a high logic value (logic high) and the first output signal VOUT+ is generated as a low logic value (logic low) when the first input signal VIN+ is logic low and the second input signal VIN− is logic high. When the first input signal VIN+ is logic high and the second input signal VIN− is logic low, the second output signal VOUT− is generated as logic low and the first output signal VOUT+ is generated as logic high.

Figure 5:
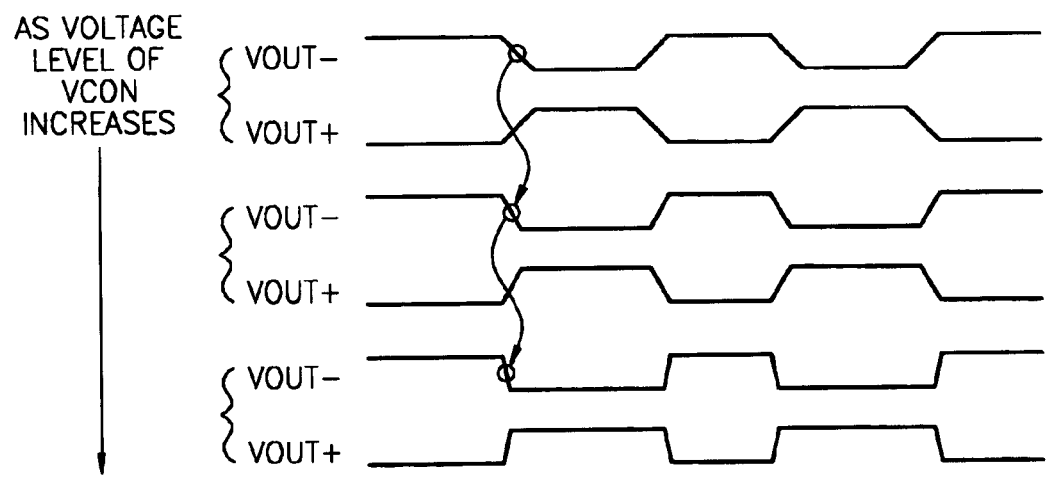
FIG. 5 illustrates an output waveform of a ring oscillator, according to an example embodiment of the present invention.

The voltage level of the control signal VCON may control the current flowing through the NMOS transistor M4 such that when the voltage level of the control signal VCON increases, the current flowing through the NMOS transistor M4 increases. As shown in the waveforms of FIG. 5 (according to an embodiment of the present invention), as the voltage level of the control signal VCON increases, transition slopes of the second output signal VOUT− and the first output signal VOUT+ become generally steeper (or, in other words, the oscillation speed increase).

Referring back to FIG. 2, the four-stage ring oscillator structure 210 normally operates based on the operation of the first ring oscillator 212 described above. In response to the first input signal VIN+ taking a value of logic low, the second output signal VOUT− of the first ring oscillator 212 is generated as logic high, and accordingly the second output signal VOUT− of the second ring oscillator 214 is generated as logic low, the second output signal VOUT− of the third ring oscillator 216 is generated as logic high and the second output signal VOUT− of the fourth ring oscillator 218 is generated as logic low. Similarly, when second input signal VIN− takes a value of logic low, ultimately the first output signal VOUT+ of the fourth ring oscillator 218 is generated as logic high. The first output signal VOUT+ of the fourth ring oscillator 218 may be fed back to and added to the first input signal VIN+ of the first ring oscillator 212. The second output signal VOUT− of the fourth ring oscillator 218 may be fed back to and added to the second input signal VIN− of the first ring oscillator 212.

By performing such operations repeatedly, the output signals C_OUT and /C_OUT of the four-stage ring oscillator structure 210 are oscillated. Also, as explained hereinabove with reference to FIG. 5, the oscillating speed of the output signals C_OUT and /C_OUT may increase as the voltage level of the control signal VCON increases, and thus, the output signals C_OUT and /C_OUT may have high frequencies.

In FIG. 2, the first through fourth duty buffers 220, 230, 240, and 250 may be used to set duty cycles of input signals of the first and second half adders 260 and 270 to 50%. As a representative of the first through fourth duty buffers 220, 230, 240, and 250, the first duty buffer 220 is shown in FIG. 6, according to an embodiment of the present invention.

Figure 6:
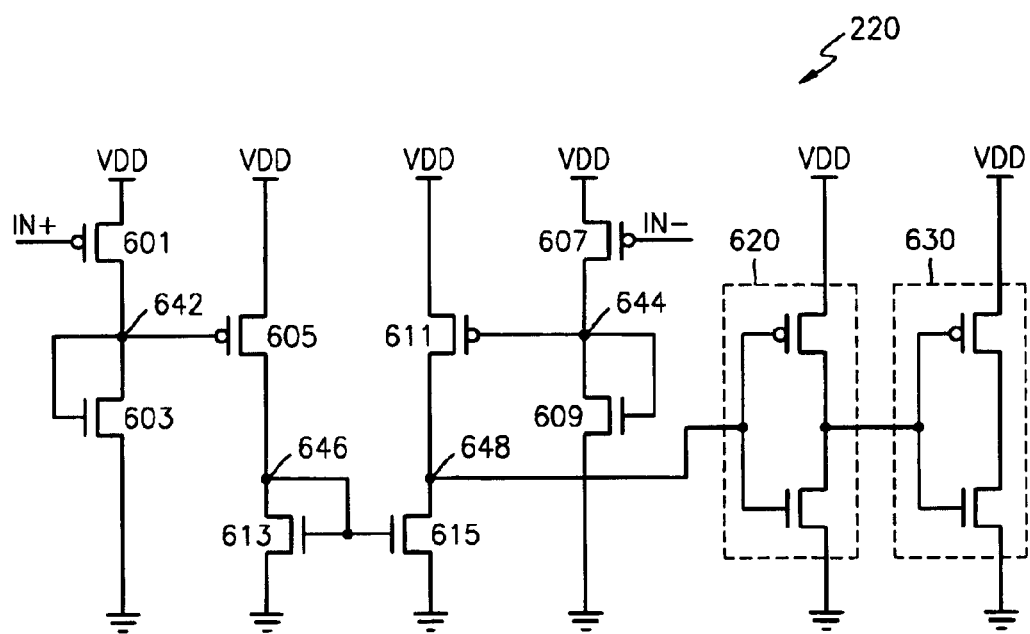
FIG. 6 illustrates a duty buffer of FIG. 2, according to an example embodiment of the present invention.

Referring to FIG. 6, the first duty buffer 220 may include a PMOS transistor 601, an NMOS transistor 603, a PMOS transistor 605, an NMOS transistor 613, a PMOS transistor 611, an NMOS transistor 615, a PMOS transistor 607, an NMOS transistor 609, and inverters 620 and 630. The PMOS transistor 601 may be connected to the supply voltage VDD and its gate may be connected to a first input signal IN+. The PMOS transistor 607 may be connected to the supply voltage VDD and may be connected to a second input signal IN−. Drains and gates of NMOS transistors 603 and 609 may be respectively connected to PMOS transistors 601 and 607 at nodes 642 and 644, respectively. A gate of the PMOS transistor 605 may be connected to node 642. A gate of the PMOS transistor 611 may be connected to node 644. The NMOS transistors 613 and 615 are generally connected to the PMOS transistors 605 and 611 in the shape of a current mirror, respectively, such that gates thereof are connected to a node 646. The inverters 620 and 630 may be serially connected with each other, an input of the inverter 620 being connected to the drains of the PMOS transistor 611 and the NMOS transistor 615 at a node 648.

The operation of the first duty buffer 220 is performed as follows. The PMOS transistors 601 and 607, the PMOS transistors 605 and 611, and the NMOS transistors 613 and 615 are designed in such a way that they are substantially symmetrical to each other. Drain currents of the PMOS transistors 601 and 607 may be given by $$Id(601) = \frac{1}{2}K(601)\left(\frac{W}{L}\right)(601)(Vsg(601) - |Vt(601)|)^2 \quad (1)$$

$$Id(607) = \frac{1}{2}K(607)\left(\frac{W}{L}\right)(607)(Vsg(607) - |Vt(607)|)^2 \quad (2)$$

Since the PMOS transistors 601 and 607 are substantially symmetrical to each other, Id (601) is treated as being substantially equal to Id (607), Id (601) is treated as being substantially equal to Id (603), and Id (607) is treated as being substantially equal to Id (609). Therefore, the following Equations 3 and 4 can be obtained.

$$Id(601) = \frac{1}{2}K(603)\left(\frac{W}{L}\right)(603)(Vsg(603) - |Vt(603)|)^2 \quad (3)$$

$$Id(601) = \frac{1}{2}K(607)\left(\frac{W}{L}\right)(607)(Vsg(607) - |Vt(607)|)^2 \quad (4)$$

The ranges of voltages between respective sources and drains of the NMOS transistors 603 and 609 may be given as:

$$\Delta Vds(603) = \Delta Vgs(603) = \sqrt{\frac{2\Delta Id(601)}{K(603)\left(\frac{W}{L}\right)(603)}} + |Vt(603)| \quad (5)$$

$$\Delta Vds(609) = \Delta Vgs(609) = \sqrt{\frac{2\Delta Id(601)}{K(609)\left(\frac{W}{L}\right)(609)}} + |Vt(609)| \quad (6)$$

If clock signals whose duty cycles are accurately 50% are input as the first and second input signals IN+ and IN−, ΔVds(603) and ΔVds(609) may be identical. Accordingly, the following Equation 7 can be obtained as:

$$\sqrt{\frac{2\Delta Id(601)}{K(603)\left(\frac{W}{L}\right)(603)}} + |Vt(603)| = \sqrt{\frac{2\Delta Id(601)}{K(609)\left(\frac{W}{L}\right)(609)}} + |Vt(609)| \quad (7)$$

Assuming that |Vt(603)|=|Vt(609)|, Equation 7 can be expressed as $$\left(\frac{W}{L}\right)(603) = \frac{K(609)}{K(603)}\left(\frac{W}{L}\right)(609) \quad (8)$$

That is, an output signal OUT whose duty cycle is substantially accurate 50% may be obtained by controlling a W/L ratio of the NMOS transistors 603 and 609.

Figure 7:
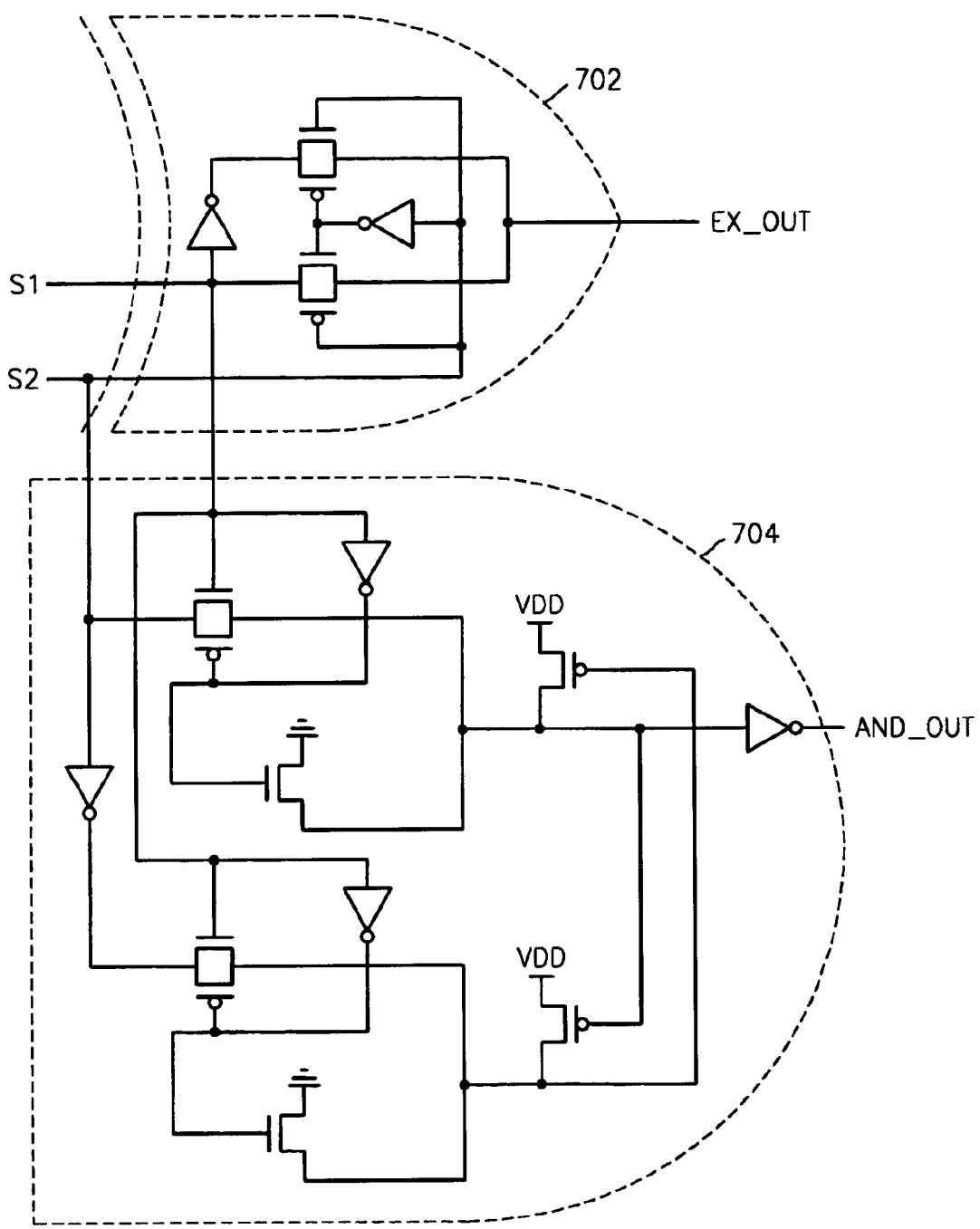
FIG. 7 illustrates a half adder of FIG. 2, according to an example embodiment of the present invention.

FIG. 7 illustrates the first half adder 260 of FIG. 2, according to an embodiment of the present invention. Half adder 260 includes a logical XOR gate 702 and a logical AND gate 704. The first half adder 260 may receive output signals X and Y of the first and second duty buffers 220 and 240 of FIG. 2 as input signals S1 and S2 and may generate output signals EX_OUT and AND_OUT.

Figure 8:
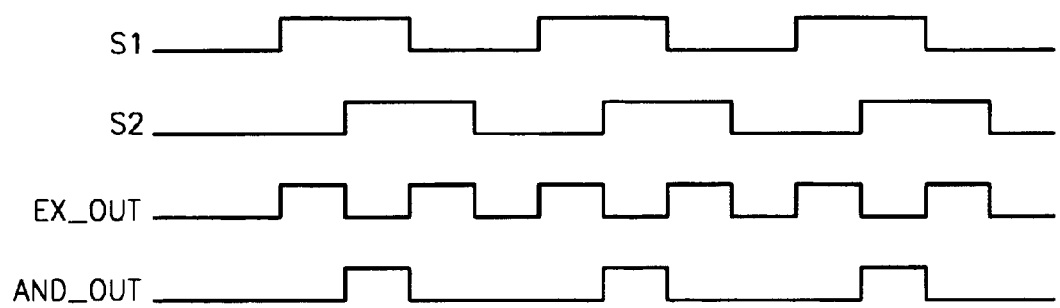
FIG. 8 illustrates waveforms of signals related to the operation of a half adder of FIG. 7, according to an example embodiment of the present invention.

The operation of the first half adder 260 will be described with reference to the waveforms of FIG. 8, according to an embodiment of the present invention. In FIG. 8, the input signals S1 and S2 are received and operated upon by XOR gate 702, which outputs the first output signal EX_OUT. Similarly, input signals S1 and S2 are also received and operated by gate 704 which outputs the second output signal AND_OUT.

The second half adder 270 may be similar to the first half adder 260. But it is to be noted that the second half adder 270 is arranged to output the inversions of signals EX_OUT and AND_OUT, namely /EX_OUT and /AND_OUT.

Referring back to FIG. 2, one of the first output signal EX_OUT (from first half adder 260), the second output signal AND_OUT, (also from first half adder 260) and the output signal C_OUT (from the four-stage ring oscillator structure 210) may be selected by the switch 290 according to an output signal of the 2:4 decoder 280, and a selected signal may be output as a high-frequency output signal OUT of the dual-band VCO circuit 200. The 2:4 decoder 280 itself may receive a frequency selection signal SEL<1:0> which can cause the 2:4 decoder 280 to select one of the signals EX_OUT, AND_OUT, and C_OUT. Similarly, another 2:4 decoder and switch could be provided to controllably select among signals /C_OUT, /EX_OUT and /AND_OUT.

Figure 9A:
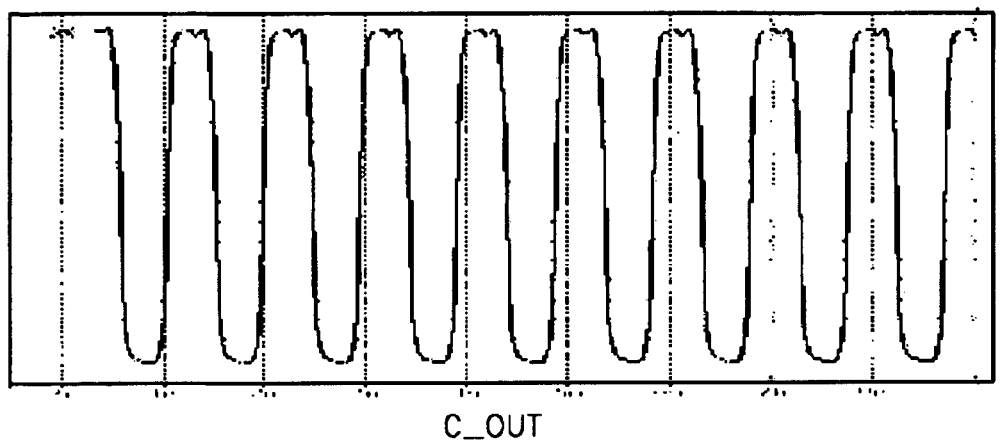
FIGS. 9A–9C and 10 illustrate simulation results obtained using a frequency synthesizer according to an example implementation of an embodiment of the present invention; and, FIGS. 11A–11C illustrate estimation results of a semiconductor chip in which a frequency synthesizer according to an example implementation of an embodiment of the present invention is integrated.
Figure 9B:
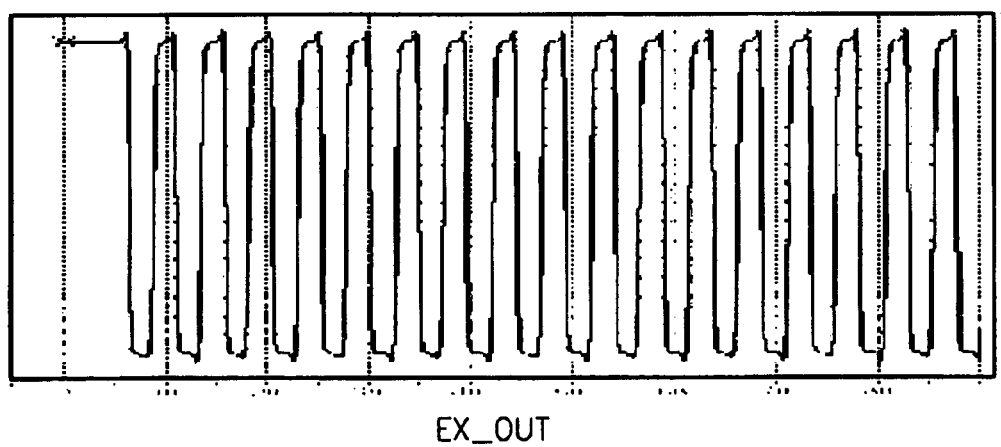
Figure 9C:
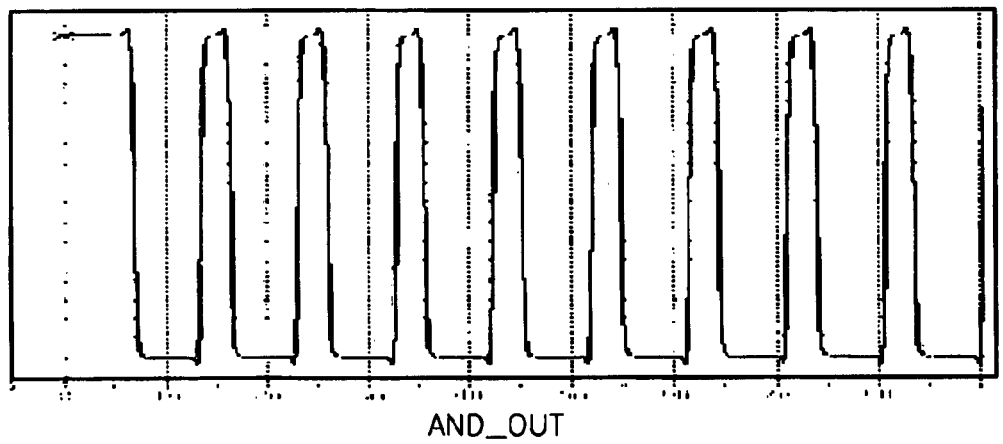

FIGS. 9A–9C and 10 illustrate simulation results obtained using the dual-band VCO circuit 200, according to an example implementation of an embodiment of the present invention. FIGS. 9A–9C illustrate waveforms of the output signal C_OUT of the four-stage ring oscillator structure 210 and the first output signal EX_OUT and the second output signal AND_OUT of the first half adder 260, where the dual-band VCO circuit 200 of FIG. 2 is simulated in the condition that the supply voltage VDD is 3.3V and the voltage level of the control signal VCON is 3.0V. The output signal C_OUT has a frequency of 1.07 GHz, the first output signal EX_OUT has a frequency of 2.1 GHz, and the second output signal AND_OUT has a frequency of 1.05 GHz. The output signal C_OUT and the second output signal AND_OUT have similar frequencies whereas the waveform of the second output signal AND_OUT is clearer than that of the output signal C_OUT.

Figure 10:
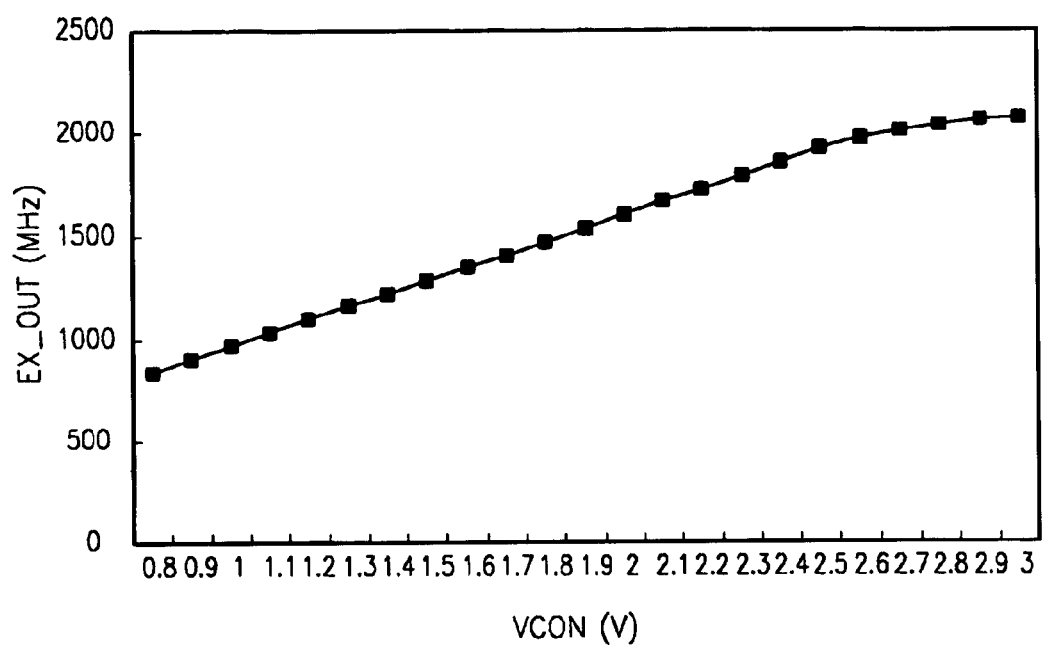

FIG. 10 illustrates an output frequency of the first output signal EX_OUT with respect to the voltage level of the control signal VCON of an example implementation of an embodiment according to the present invention. Referring to FIG. 10, the output frequency of the first output signal EX_OUT generally increases substantially linearly when the voltage level of the control signal VCON ranges from 0.8V to 2.7V. However, the output frequency of the first output signal EX_OUT typically does not change significantly after the voltage level of the control signal VCON reaches 2.8V.

Figure 11A:
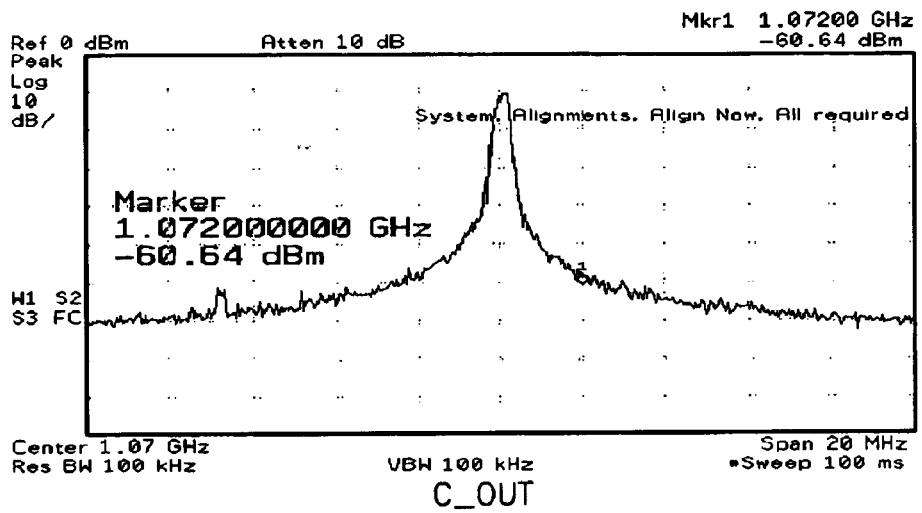
Figure 11B:
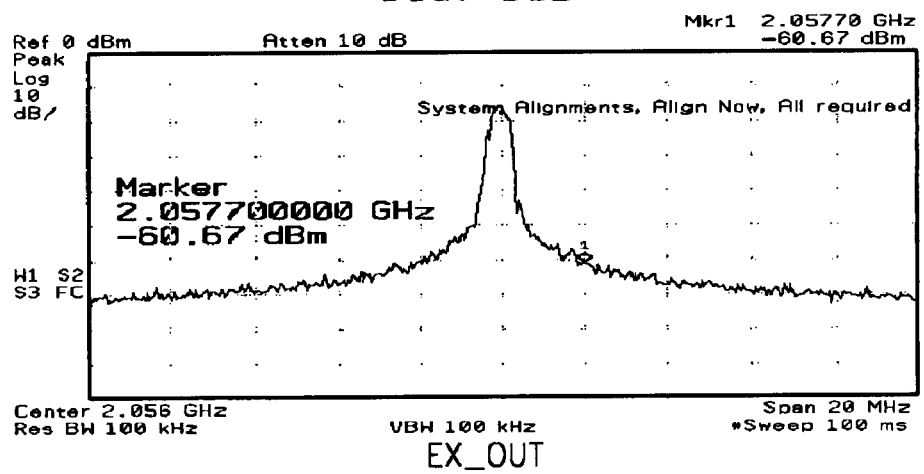
Figure 11C:
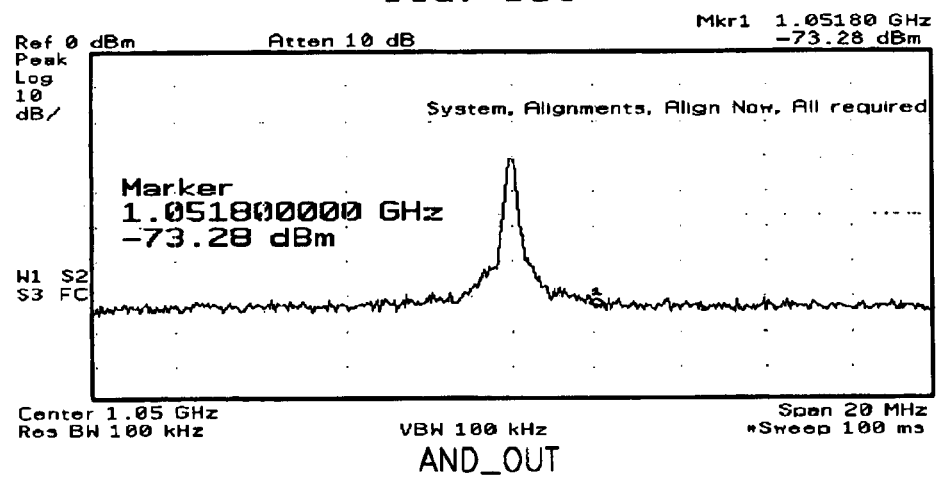

FIG. 11 shows frequency characteristics of the output signal C_OUT of the four-stage ring oscillator structure 210 and the first output signal EX_OUT and the second output signal AND_OUT of the first half adder 260, which are estimated in an example implementation of a semiconductor chip in which the dual-band VCO circuit 200 of FIG. 2 is integrated. Referring to FIG. 11, similarly with the simulation results of FIG. 9, the output signal C_OUT has a frequency of 1.072 GHz, the first output signal EX_OUT has a frequency of 2.057 GHz, and the second output signal AND_OUT has a frequency of 1.051 GHz.

While the present invention has been particularly shown and described with reference to exemplary embodiments thereof, it will be understood by those of ordinary skill in the art that various changes in form and details may be made without departing from the spirit and scope of the invention as defined by the appended claims and their equivalents.

What is claimed is:

1. A frequency synthesizer comprising:
   a ring oscillator circuit, which receives a pair of input signals and is operable to generate a pair of oscillating signals;
   duty buffers, which receive the pair of oscillating signals, respectively and are operable to generate output signals with predetermined duty cycles, respectively;
   half adders, which receive the predetermined duty cycle signals from the duty buffers and generate a first output signal as a result of an Exclusive-OR (XOR) operation on the output signals of the duty buffers and an output signal as a result of an AND operation on the predetermined duty cycle signals; and
   a switch, which selects one of the oscillating signals of the ring oscillator circuit, the XOR result and the AND result, according to a switch-control signal.

2. The frequency synthesizer of claim 1, wherein the ring oscillator circuit includes an even number of ring oscillators, receives the pair of input signals at a pair of input terminals and feeds back the pair of oscillating signals to the pair of input terminals.

3. The frequency synthesizer of claim 2, wherein each of the ring oscillators comprises:
   first and second PMOS transistors having sources connected to a supply voltage and whose gates are connected to a first bias signal;
   a third PMOS transistor having a source connected to a drain of the first PMOS transistor and a gate connected to a first one of the pair of input signals;
   a first NMOS transistor having a drain connected at a first node to a drain of the third PMOS transistor and a gate connected to receive the first one of the pair of input signals;
   a fourth PMOS transistor having a source is connected to a drain of the second PMOS transistor and a gate connected to receive a second one of the pair of input signals;
   a second NMOS transistor having a drain connected at a second node to a drain of the fourth PMOS transistor and a gate connected to receive the second one of the pair of input signals;
   a third NMOS transistor having a gate connected to receive a control signal, a drain connected to sources of the first and second NMOS transistors, and a drain connected to ground voltage;
   a fifth PMOS transistor having a source and a drain respectively connected to source and drain of the third PMOS transistor, a gate of the fifth PMOS transistor being connected to the source thereof;
   a sixth PMOS transistor having a source and a drain respectively connected to the gate and drain of the fourth PMOS transistor, a gate of the sixth PMOS transistor being connected to the source thereof;
   a fourth NMOS transistor having a drain connected to the drain of the fifth PMOS transistor and a gate connected to the drain of the sixth PMOS transistor;
   a fifth NMOS transistor having a drain connected to the drain of the sixth PMOS transistor and a gate connected to the drain of the fifth PMOS transistor; and
   a sixth NMOS transistor having a gate connected to receive a second bias signal, a drain sources of the fourth and fifth NMOS transistors, and a gate connected to the ground voltage,
   wherein signals on the first and second nodes represent the pair of oscillating signals.

4. The frequency synthesizer of claim 1, wherein the duty cycles of output signals of the duty buffers are about 50%.

5. The frequency synthesizer of claim 1, wherein each of the duty buffers comprises:
   a first PMOS transistor having a source connected to the supply voltage and a gate connected to receive a first one of the input signals;
   a second PMOS transistor having a source connected to the supply voltage and a gate connected to receive a second one of the input signals;
   first and second NMOS transistors having drains and gates connected a first and second nodes to the drains of the first and second PMOS transistors, respectively;
   a third PMOS transistor having a source connected to the supply voltage and a gate connected to the first node;
   a fourth PMOS transistor having a source connected to the supply voltage and a gate connected to the second node;

third and fourth NMOS transistors having drains are connected to the drains of the third and fourth PMOS transistors, respectively, and sources connected to a ground voltage, and gates connected to the drain of the third NMOS transistor; and serially-connected inverters, an input to a first one of the inverters being connected to the drains of the fourth PMOS transistor and the fourth NMOS transistor.

6. The frequency synthesizer of claim 1, further comprising:

a decoder to decode a frequency selection signal and produce the switch-control signal.

7. A frequency synthesizer comprising:

a ring oscillator circuit, which receives a pair of input signals and, in response to a control signal, is operable to generate a pair of first oscillating signals, a pair of second oscillating signals, and a pair of third oscillating signals that are delayed with respect to each other;

first and second duty buffer circuits, which receive the pair of first oscillating signals and the pair of second oscillating signals and in response generate first and second duty signals, respectively;

half adder means for receiving output signals of the duty buffer means and for responsively generating a first output signal according to an Exclusive-OR operation upon the first and second duty signals and a second output signal according to an AND operation upon the first and second duty signals; and switch means for selecting one of the third pair of oscillating signals, the first output signal and the second output signal.

8. The frequency synthesizer of claim 7, the ring oscillator means is further operable for scaling frequencies of the first pair of oscillating signals, the second pair of oscillating signals, and the third pair of oscillating signals to be proportional with the voltage level of the control signal.

9. The frequency synthesizer of claim 7, wherein the ring oscillator circuit comprises:

first ring oscillator means for receiving the pair of input signals and for generating the pair of first oscillating signals;

second ring oscillator means for receiving the pair of first oscillating signals;

third ring oscillator means for receiving output signals of the second ring oscillator and for generating the pair of second oscillating signals; and fourth ring oscillator means for receiving the pair of second oscillating signals, for generating the pair of third oscillating signals, and for feeding back the pair of third oscillating signals to input terminals of the first ring oscillator means.

10. The frequency synthesizer of claim 7, wherein the ring oscillator circuit comprises:

first and second PMOS transistors having sources connected to a supply voltage and whose gates are connected to a first bias signal;

a third PMOS transistor having a source connected to a drain of the first PMOS transistor and a gate connected to a first one of the pair of input signals;

a first NMOS transistor having a drain connected at a first node to a drain of the third PMOS transistor and a gate connected to receive the first one of the pair of input signals;

a fourth PMOS transistor having a source connected to a drain of the second PMOS transistor and a gate connected to receive a second one of the pair of input signals;

a second NMOS transistor having a drain connected at a second node to a drain of the fourth PMOS transistor and a gate connected to receive the second one of the pair of input signals;

a third NMOS transistor having a gate connected to receive a control signal, a drain connected to sources of the first and second NMOS transistors, and a drain connected to ground voltage;

a fifth PMOS transistor having a source and a drain respectively connected to source and drain of the third PMOS transistor, a gate of the fifth PMOS transistor being connected to the source thereof;

a sixth PMOS transistor having a source and a drain respectively connected to the gate and drain of the fourth PMOS transistor, a gate of the sixth PMOS transistor being connected to the source thereof;

a fourth NMOS transistor having a drain connected to the drain of the fifth PMOS transistor and a gate connected to the drain of the sixth PMOS transistor;

a fifth NMOS transistor having a drain connected to the drain of the sixth PMOS transistor and a gate connected to the drain of the fifth PMOS transistor; and a sixth NMOS transistor having a gate connected to receive a second bias signal, a drain sources of the fourth and fifth NMOS transistors, and a gate connected to the ground voltage, wherein signals on the first and second nodes represent one of the pairs of oscillating signals.

11. The frequency synthesizer of claim 7, wherein each of the duty buffers comprises:

a first PMOS transistor having a source connected to the supply voltage and a gate connected to receive a first one of the input signals;

a second PMOS transistor having a source connected to the supply voltage and a gate connected to receive a second one of the input signals;

first and second NMOS transistors having drains and gates connected a first and second nodes to the drains of the first and second PMOS transistors, respectively;

a third PMOS transistor having a source connected to the supply voltage and a gate connected to the first node;

a fourth PMOS transistor having a source connected to the supply voltage and a gate connected to the second node;

third and fourth NMOS transistors having drains are connected to the drains of the third and fourth PMOS transistors, respectively, and sources connected to a ground voltage, and gates connected to the drain of the third NMOS transistor; and serially-connected inverters, an input to a first one of the inverters being connected to the drains of the fourth PMOS transistor and the fourth NMOS transistor.

12. The frequency synthesizer of claim 7, wherein the switch means is further operable for decoding a frequency selection signal and for making the selection based upon the frequency selection signal.

13. A frequency synthesizing method comprising:

receiving a pair of input signals;

generating response to a control signal, a pair of first oscillating signals, a pair of second oscillating signals, and a pair of third oscillating signals that are delayed with respect to each other;

generating first and second duty signals based upon the pair of first oscillating signals and the pair of second oscillating signals, respectively;

generating a first output signal as a result of an Exclusive-OR operation upon the first and second duty signals;

generating a second output signal as a result of an AND operation upon the first and second duty signals; and selecting one of the third pair of oscillating signals, the first output signal and the second output signal.

14. The frequency synthesizing method of claim 13, wherein the generation of pairs of oscillating signals includes:

scaling the ring frequencies of the first pair of oscillating signals, the second pair of oscillating signals, and the third pair of oscillating signals to be proportional with the voltage level of the control signal.

15. The frequency synthesizing method of claim 13, wherein the duty cycles of the first and second duty signals are about 50%.

* * * * *